United States Patent
Nishi et al.

(10) Patent No.: US 7,985,926 B2
(45) Date of Patent: Jul. 26, 2011

(54) PRINTED CIRCUIT BOARD AND ELECTRONIC COMPONENT DEVICE

(75) Inventors: Kensuke Nishi, Ibaraki (JP); Akinori Itokawa, Ibaraki (JP); Visit Thaveeprungsriporn, Ibaraki (JP)

(73) Assignee: Nitto Denko Corporation, Osaka (JP)

(*) Notice: Subject to any disclaimer, the term of this patent is extended or adjusted under 35 U.S.C. 154(b) by 944 days.

(21) Appl. No.: 11/870,769

(22) Filed: Oct. 11, 2007

(65) Prior Publication Data

US 2008/0099237 A1    May 1, 2008

(30) Foreign Application Priority Data

Oct. 27, 2006  (JP) ................................ 2006-292803

(51) Int. Cl.
   *H05K 1/00* (2006.01)
(52) U.S. Cl. ........................................ 174/252; 174/260
(58) Field of Classification Search .................. 174/252, 174/260, 261
   See application file for complete search history.

(56) References Cited

U.S. PATENT DOCUMENTS

| | | | |
|---|---|---|---|
| 4,835,598 A | | 5/1989 | Higuchi et al. |
| 5,113,315 A | * | 5/1992 | Capp et al. ................ 361/704 |
| 5,710,459 A | | 1/1998 | Teng et al. |
| 6,156,980 A | * | 12/2000 | Peugh et al. ............... 174/252 |
| 7,026,664 B2 | * | 4/2006 | Divakar et al. ............. 257/107 |
| 7,031,165 B2 | * | 4/2006 | Itabashi et al. ............. 361/719 |
| 7,495,177 B2 | * | 2/2009 | Kataoka et al. ............. 174/255 |
| 2002/0172025 A1 | * | 11/2002 | Megahed et al. ............ 361/767 |
| 2004/0000711 A1 | | 1/2004 | Barcley |
| 2004/0037044 A1 | | 2/2004 | Cook et al. |
| 2005/0073039 A1 | | 4/2005 | Kasuya et al. |
| 2006/0118940 A1 | | 6/2006 | Kasuya et al. |
| 2009/0097254 A1 | | 4/2009 | Kawashima et al. |

FOREIGN PATENT DOCUMENTS

| | | |
|---|---|---|
| JP | 02063141 A | 3/1990 |
| JP | 07086718 A | 3/1995 |
| JP | 2002162626 A | 6/2002 |
| JP | 2003-282778 A | 10/2003 |
| JP | 2004079855 A | 3/2004 |
| JP | 2005252047 A | 9/2005 |
| JP | 2006286347 A | 10/2006 |

OTHER PUBLICATIONS

Office Action dated Mar. 26, 2010 in counterpart Chinese Application No. 200710167549.9, 6 pages.
Office Action Issued Nov. 30, 2010 in Japanese Application No. 2006-292803.

* cited by examiner

*Primary Examiner* — Ishwarbhai B Patel
(74) *Attorney, Agent, or Firm* — Panitch Schwarze Belisario & Nadel LLP

(57) ABSTRACT

A base material in which a base insulating layer and a metallic layer are laminated is prepared. The metallic layer is processed into a predetermined pattern to form conductor patterns including terminal parts. A hole is formed in a region under a predetermined terminal part where the base insulating layer is formed by directing a laser beam from below. A reinforcing board having a through hole is attached to the lower surface of the base insulating layer by a sheet-like adhesive having a through hole, with the holes being aligned with one another. An opening space formed by the holes is filled with metallic paste by screen printing. In this way, a printed circuit board is fabricated. An electronic component is mounted on this printed circuit board.

5 Claims, 12 Drawing Sheets

F I G. 10
(c)
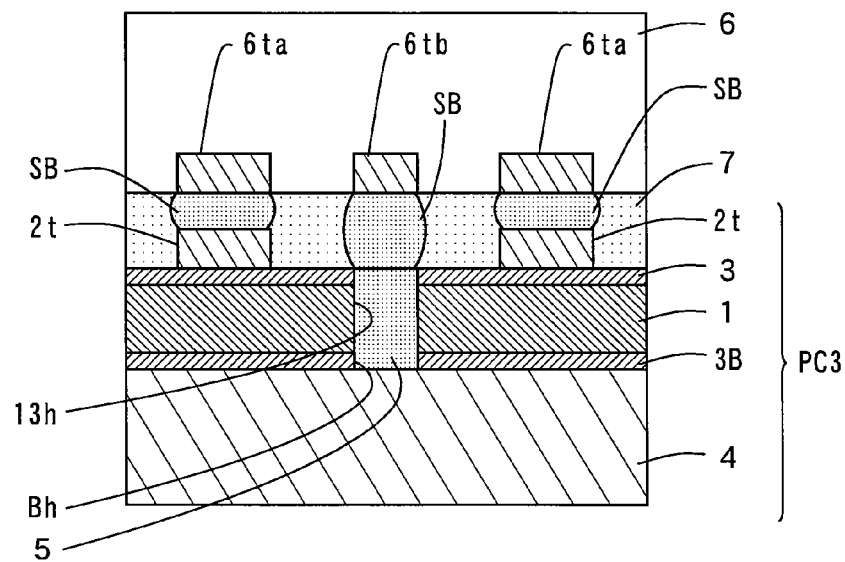
(d)
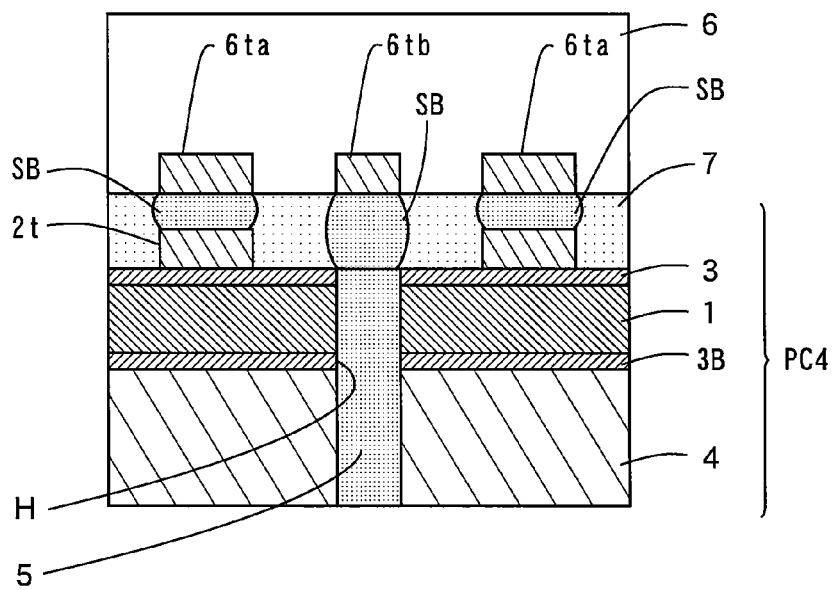

PRINTED CIRCUIT BOARD AND ELECTRONIC COMPONENT DEVICE

BACKGROUND OF THE INVENTION

1. Field of the Invention

The present invention relates to a printed circuit board and an electronic component device.

2. Description of the Background Art

Electronic components such as semiconductor devices or the like generate heat by being driven. When the electronic components generate excess heat, the electronic components malfunction in some cases. Thus, a semiconductor device and a printed circuit board that radiate heat of the electronic components have been proposed to prevent such malfunction of the electronic components (see JP 2003-282778 A, for example).

FIG. 12 is a diagram for use in describing a structure of the semiconductor device of JP 2003-282778 A. In the semiconductor device, a semiconductor device substrate (IC board) 92 as an electronic component is mounted on a printed circuit board 911 by using the flip chip mounting technique.

Specifically, a heat radiation joining bump 98a and an electrically connecting bump 98b are formed on one surface of the semiconductor device substrate 92, and a heat radiation joining pad 912a and an electrically connecting pad 912b are formed on one surface of the printed circuit board 911.

The heat radiation joining pad 98a and the electrically connecting bump 98b of the semiconductor device substrate 92 are connected to the heat radiation joining pad 912a and the electrically connecting pad 912b of the printed circuit board 911, respectively.

In the printed circuit board 911, openings 91h are formed in a region where the heat radiation joining pad 912a is formed. The openings 91h are filled with silver paste 914.

A metal reinforcing board 916 for heat radiation, which is made from aluminum material or the like, is bonded by using an adhesive 915 to the other surface of the printed circuit board 911 to which the semiconductor device substrate 92 is not connected.

When the semiconductor device is driven, the heat that is generated from the semiconductor device substrate 92 is transmitted to the metal reinforcing board 916 for heat radiation through the heat radiation joining bump 98a, the heat radiation joining pad 912a and the silver paste 914, and diffused from the metal reinforcing board 916 for heat radiation.

Here, the inventors prepared the semiconductor device of FIG. 12 and a semiconductor device without the opening 91h in the configuration of FIG. 12, and evaluated the heat radiation performance of each device.

This evaluation was performed by driving the respective semiconductor device substrates 92 that were provided on the prepared two semiconductor devices, measuring the temperature of the semiconductor device substrates 92 after a predetermined time (about 20 min.), and comparing the values of the measured temperature.

As a result, the measured temperature value of the semiconductor device of FIG. 12 was about two or three degrees lower than the measured temperature value of the semiconductor device without the opening 91h. However, it is desired that the heat radiation from the electronic components that are mounted on the printed circuit board is performed further sufficiently.

SUMMARY OF THE INVENTION

One object of the present invention is to provide a printed circuit board and an electronic component device capable of sufficiently improving heat radiation of an electronic component.

(1) According to an aspect of the present invention, a printed circuit board on which an electronic component having a plurality of external terminals is to be mounted includes an insulating layer having a through hole, a terminal part provided on one surface of the insulating layer and connectable to any of the plurality of external terminals of the electronic component, a reinforcing board having thermal conductivity, provided on the other surface of the insulating layer, and a thermal conductive material filled in the through hole, wherein the thermal conductive material is brought into contact with the terminal part or exposed on the one surface of the insulating layer to be connectable to any of the plurality of external terminals of the electronic component, while also brought into contact with the reinforcing board.

In this printed circuit board, the through hole is provided in the insulating layer, and the thermal conductive material is filled in the through hole. The one surface of the insulating layer is provided with the terminal part, and the other surface of the insulating layer is provided with the reinforcing board having thermal conductivity. The thermal conductive material is in contact with the reinforcing board.

Any of the plurality of external terminals of the electronic component is connected to the terminal part provided on the one surface of the insulating layer, so that the electronic component is mounted thereon.

In this state, any of the plurality of external terminals of the electronic component is connected with the thermal conductive material through the terminal part. Alternatively, any of the plurality of external terminals of the electronic component is brought into contact with the thermal conductive material being exposed on the one surface of the insulating layer.

Thus, the heat generated from the electronic component is transmitted from any of the plurality of external terminals to the reinforcing board through the terminal part and the thermal conductive material. Alternatively, the heat generated from the electronic component is transmitted from any of the plurality of external terminals to the reinforcing board through the thermal conductive material.

Then, the heat transmitted to the reinforcing board is efficiently diffused from the outer surface thereof. Consequently, the heat radiation of the electronic component is improved sufficiently.

(2) The printed circuit board may further includes an adhesive layer provided between the insulating layer and the reinforcing board, wherein the adhesive layer may have a hole that communicates with the through hole, and the thermal conductive material may be filled in the through hole of the insulating layer and the hole of the adhesive layer so as to be brought into contact with the reinforcing board.

In this case, the insulating layer and the reinforcing board are reliably bonded by the adhesive layer. The heat generated from the electronic component that is mounted on the printed circuit board is reliably transmitted to the reinforcing board through the thermal conductive material filled in the through hole provided in the insulating layer and the hole provided in the adhesive layer. Accordingly, the heat of the electronic component can be radiated reliably and efficiently.

(3) The reinforcing board may have an opening that communicates with the through hole, and the thermal conductive material may be filled in the through hole and the opening.

This enables a contact area of the thermal conductive material and the reinforcing board to be larger. Thus, the heat of the electronic component can be radiated reliably and efficiently.

(4) The through hole may be provided in a region of the insulating layer on a back surface side of the terminal part, and the thermal conductive material may be filled in the through hole so as to be brought into contact with the back surface of the terminal part.

Accordingly, the heat of the electronic component can be radiated readily only by mounting the electronic component on the printed circuit board.

(5) The through hole may be provided in a region of the insulating layer excluding the terminal part, and the thermal conductive material may be filled in the through hole so as to be exposed on the one surface of the insulating layer.

In this case, the external terminal of the electronic component can be connected to the thermal conductive material exposed on the one surface of the insulating layer in the region of the insulating layer excluding the terminal part. Thus, the number of the terminal parts provided on the one surface of the insulating layer can be reduced.

(6) The through hole of the insulating layer may include a plurality of through holes, and the thermal conductive material may be filled in the plurality of through holes.

In this case, the heat generated from the electronic component is efficiently transmitted to the reinforcing board through the thermal conductive material filled in the plurality of through holes. Consequently, the heat radiation of the electronic component is improved further sufficiently.

(7) A plurality of portions in the reinforcing board that are in contact with the thermal conductive material in the plurality of through holes may be insulated from one another.

This prevents the plurality of external terminals of the electronic component from being electrically connected with one another through the thermal conductive material and the reinforcing board.

(8) According to another aspect of the present invention, an electronic component device includes an electronic component including a plurality of external terminals, and a printed circuit board on which the electronic component is mounted, wherein the printed circuit board includes an insulating layer having a through hole, a terminal part provided on one surface of the insulating layer and connected to any of the plurality of external terminals of the electronic component, a reinforcing board having thermal conductivity, provided on the other surface of the insulating layer, and a thermal conductive material filled in the through hole, wherein the thermal conductive material is brought into contact with the terminal part or exposed on the one surface of the insulating layer to be connectable any of the plurality of external terminals of the electronic component, while being brought into contact with the reinforcing board.

In this electronic component device, the electronic component is mounted on the printed circuit board. In the printed circuit board, the insulating layer is provided with the through hole having the thermal conductive material filled therein. The one surface of the insulating layer is provided with the terminal part, and the other surface of the insulating layer is provided with the reinforcing board having thermal conductivity. The thermal conductive material is in contact with the reinforcing board.

Any of the plurality of external terminals of the electronic component is connected to the terminal part provided on the one surface of the insulating layer, so that the electronic component is mounted on the printed circuit board.

In this state, any of the plurality of external terminals of the electronic component is brought into contact with the thermal conductive material through the terminal part. Alternatively, any of the plurality of external terminals of the electronic component is brought into contact with the thermal conductive material that is exposed on the one surface of the insulating layer.

Thus, the heat generated from the electronic component is transmitted from any of the plurality of external terminals to the reinforcing board through the terminal part and the thermal conductive material. Alternatively, the heat generated in the electronic component is transmitted from any of the plurality of external terminals to the reinforcing board through the thermal conductive material.

Then, the heat transmitted to the reinforcing board is efficiently diffused from the outer surface thereof. Consequently, the heat radiation of the electronic component is sufficiently improved.

Other features, elements, characteristics, and advantages of the present invention will become more apparent from the following description of preferred embodiments of the present invention with reference to the attached drawings.

BRIEF DESCRIPTION OF THE DRAWINGS

FIG. 10 is a diagram showing the electronic component device of the inventive example;

DESCRIPTION OF THE PREFERRED EMBODIMENTS

A printed circuit board and an electronic component device according to one embodiment of the present invention will now be described.

First Embodiment

Figure 1:
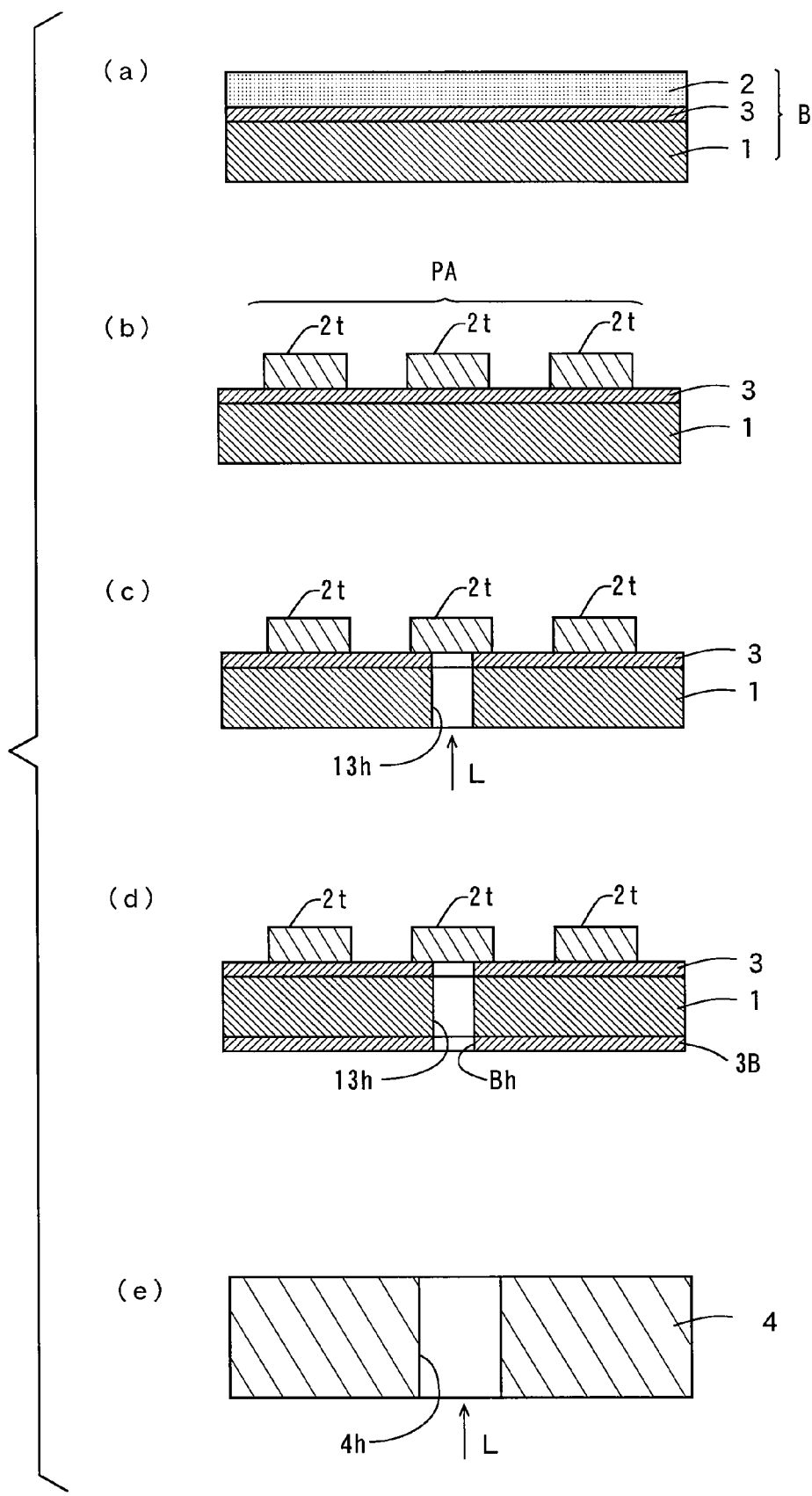
FIG. 1 is a manufacturing process diagram for use in describing an example of a printed circuit board and an electronic component device according to a first embodiment.
Figure 2:
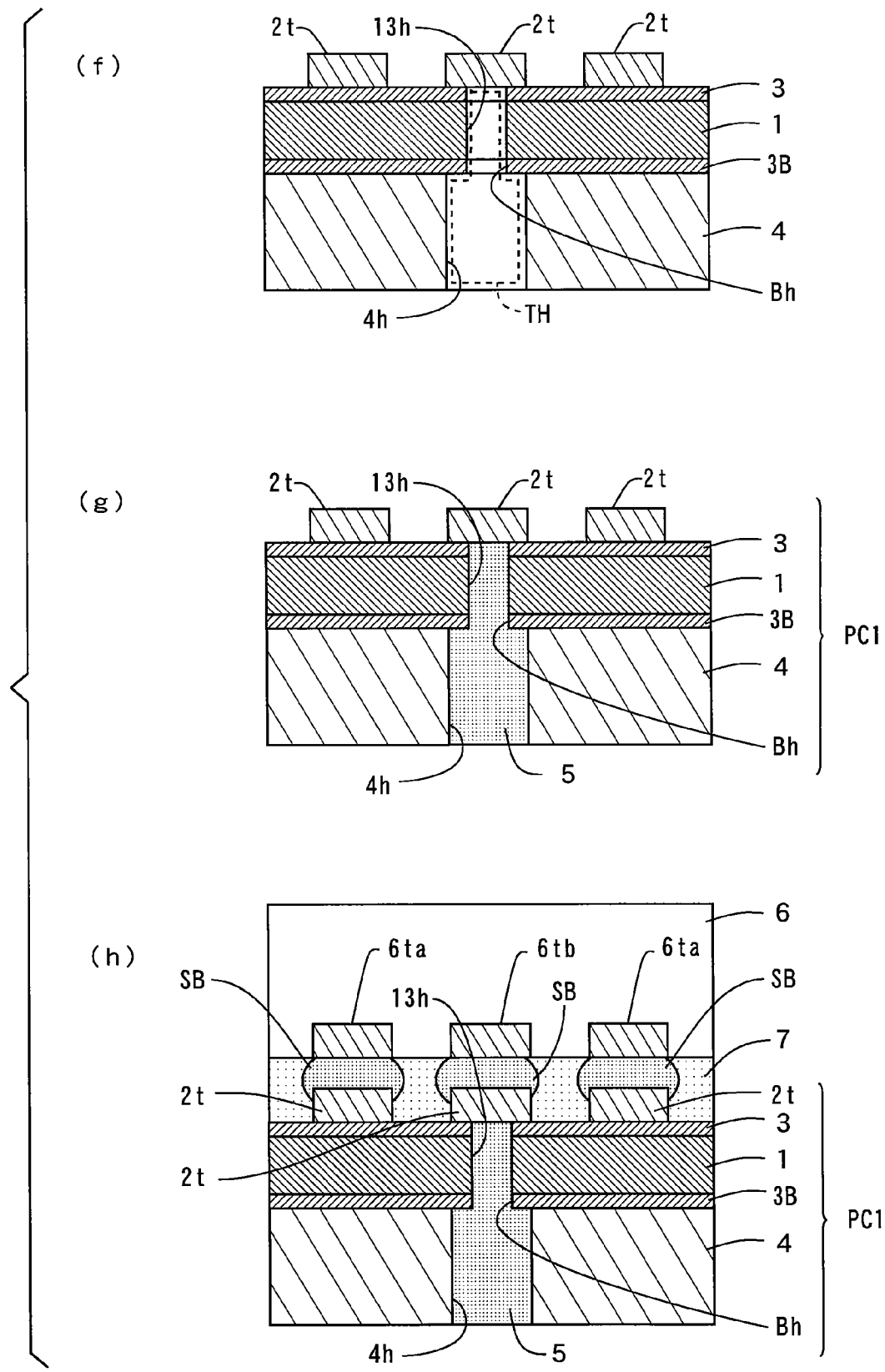
FIG. 2 is a manufacturing process diagram for use in describing the example of the printed circuit board and the electronic component device according to the first embodiment.

FIG. 1 and FIG. 2 are manufacturing process diagrams for use in explaining an example of a printed circuit board and an electronic component device according to a first embodiment.

A printed circuit board according to this embodiment is fabricated as follows. First of all, a base material BW is prepared as shown in FIG. 1(a). The base material BW has a configuration where a base insulating layer 1 and a metallic layer 2 are laminated with a sheet-like adhesive 3 sandwiched therebetween.

Insulating resin, such as a polyimide film or the like, for example, is used as the base insulating layer 1. The thickness of the base insulating layer 1 is preferably about 4 to 25 μm.

A metallic foil, such as a stainless-steel foil, a nickel foil, a copper foil or the like, for example, is used as the metallic layer 2. The thickness of the metallic layer 2 is preferably about 10 to 50 μm.

As shown in FIG. 1(b), the metallic layer 2 on the base insulating layer 1 is processed into a predetermined pattern. Thus, terminal parts 2t for use in mounting an electronic component thereon and a conductor pattern PA including wiring parts are formed on the base insulating layer 1. FIG. 1(b) shows only the terminal parts 2t of the conductor pattern PA.

The conductor pattern PA can be obtained, for example, by forming an etching resist having a predetermined pattern on an upper surface of the metallic layer 2, etching the exposed parts of the metallic layer 2 in a region where the etching resist is not formed, then removing the etching resist (a subtractive method). Alternatively, the conductor pattern PA on the base insulating layer 1 may be formed by an additive method or a semi-additive method.

The terminal parts 2t are formed as, for example, pad terminals or pad terminals to which wirings are connected integrally.

Next, as shown in FIG. 1(c), a hole 13h is formed in the base insulating layer 1 and the sheet-like adhesive 3 by irradiating a region of the base insulating layer 1 and the sheet-like adhesive 3 under a predetermined terminal 2t with a laser beam L from the lower surface of the base insulating layer 1. In this way, the lower surface of the terminal part 2t is exposed inside the hole 13h.

Note that the above laser beam L is a YAG (yttrium aluminum garnet) laser beam having a wavelength of, for example, 1064 nm. The diameter of the hole 13h is about 25 to 100 μm, for example.

Then, as shown in FIG. 1(d), a sheet-like adhesive 3B where a through hole Bh having substantially the same diameter as that of the hole 13h is formed is attached to the lower surface of the base insulating layer 1.

When the sheet-like adhesive 3B is attached, the hole 13h which is formed in the base insulating layer 1 and the sheet-like adhesive 3 and the through hole Bh which is formed in the sheet-like adhesive 3B are aligned to each other.

In this embodiment, the thicknesses of the sheet-like adhesives 3, 3B are preferably about 0 to 25 μm, for example.

Then, as shown in FIG. 1(e), a reinforcing board 4 made with a metal is prepared and irradiated with the laser beam L. Thus, a through hole 4h having substantially the same diameter as those of the hole 13h and the through hole Bh formed in the base insulating layer 1 and the sheet-like adhesives 3, 3B, or a larger diameter than those of the hole 13h and the through hole Bh formed in the reinforcing board 4.

As the reinforcing board 4, a metallic board such as a stainless-steel board, an aluminum board or the like is used, for example. The thickness of the reinforcing board 4 is preferably about 50 to 500 μm.

Next, as shown in FIG. 2(f), the reinforcing board 4 is attached to the lower surface of the base insulating layer 1 by the sheet-like adhesive 3B. Here, the hole 13h and the through hole Bh are also aligned with the through hole 4h, when the reinforcing board 4 is attached to the base insulating layer 1.

In this way, the internal spaces of the hole 13h in the base insulating layer 1 and the sheet-like adhesive 3, the through hole Bh of the sheet-like adhesive 3B and the through hole 4h in the reinforcing board 4 communicate with one another, so that an opening space TH is formed.

As shown in FIG. 2(g), the formed opening space TH is filled with metallic paste 5 by screen printing. A material which is superior in thermal conductivity, such as Cu (copper) paste, Ag (silver) paste or the like, for example, is used as the metallic paste 5. With the opening space TH filled with the metallic paste 5 in the above manner, the terminal part 2t and the reinforcing board 4 are connected by the metallic paste 5. In this way, a printed circuit board PC1 is fabricated.

Finally, as shown in FIG. 2(h), an electronic component 6 is mounted on the printed circuit board PC1.

In this embodiment, the electronic component 6 is provided with electrically connecting terminals 6ta and a heat radiating terminal 6tb. The electrically connecting terminals 6ta are electrically connected to a circuit and wirings which are incorporated in the electronic component 6. On the other hand, the heat radiating terminal 6tb is electrically insulated from the circuit and the wirings which are incorporated in the electronic component 6.

The heat radiating terminal 6tb may also serve as an electrically connecting terminal for signal transmission or ground connection.

When the electronic component 6 is mounted, the respective terminal parts 2t of the printed circuit board PC1 and the electrically connecting terminals 6ta and the heat radiating terminal 6tb of the electronic component 6 are heated and pressurized with solder balls SB sandwiched therebetween to join the electronic component 6 and the printed circuit board PC1. Then, sealing resin (underfill) 7 is filled in a gap between the printed circuit board PC1 and the electronic component 6. Liquid epoxy resin, for example, is used as the sealing resin 7. Thus, an electronic component device according to the first embodiment is completed.

According to this embodiment, the heat radiating terminal 6tb of the electronic component 6 is connected to the terminal part 2t which is connected with the metallic paste 5 of FIG. 2(g). In this way, the heat radiating terminal 6tb of the electronic component 6 is connected with the reinforcing board 4 through the metallic paste 5 which is superior in thermal conductivity. Then, the heat generated in the electronic component 6 is transmitted from the heat radiating terminal 6tb to the reinforcing board 4 through the solder ball SB, the terminal part 2t and the metallic paste 5, and efficiently diffused from the outer surface thereof. As a result, the heat radiation of the electronic component 6 is improved sufficiently.

In addition, according to this embodiment, since the metallic paste 5 is also filled in the through hole 4h which is formed in the reinforcing board 4, a contact area of the metallic paste 5 and the reinforcing board 4 is large. Thus, the heat radiation of the electronic component 6 is improved further sufficiently.

Another Configuration Example

In this embodiment, the electrically connecting terminals 6ta of the electronic component 6 may be used for heat radiation of the electronic component 6 as well as for electrical signal transmission or ground connection similarly to the case of the heat radiating terminal 6tb.

Figure 3:
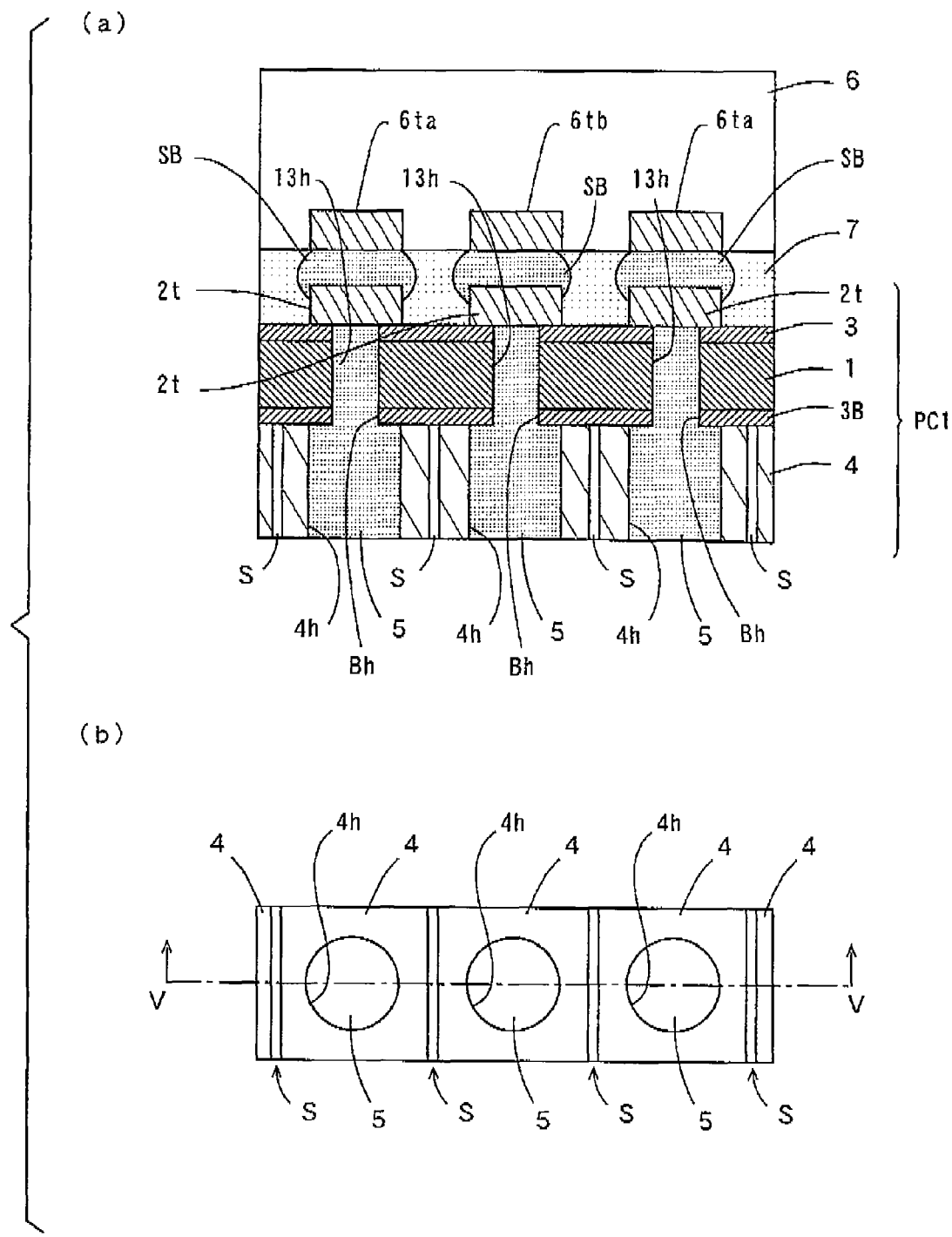
FIG. 3(a) is a cross sectional view and FIG. 3(b) is a bottom plan view each showing another example of the electronic component device according to the first embodiment.

FIG. 3 is a diagram showing another example of the electronic component device according to the first embodiment. In the printed circuit board PC1 of FIG. 3, the holes 13h and the through holes Bh, 4h are formed in the regions of the base insulating layer 1, the sheet-like adhesive 3, 3B and the reinforcing board 4 under the three terminal parts 2t. Each of the opening spaces TH (see FIG. 2(f)) is filled with the metallic paste 5.

In this example, slits S are formed in the reinforcing board 4 to prevent the metallic paste 5, which is connected to the plurality of terminal parts 2t, from being electrically connected to one another through the reinforcing board 4.

Accordingly, in the electronic component device of the this example, the heat generated in the electronic component 6 is transmitted from the two electrically connecting terminals 6ta and the heat radiating terminal 6tb to the reinforcing board 4 through the metallic paste 5, and diffused from the reinforcing board 4. Consequently, the heat radiation of the electronic component 6 is improved further sufficiently.

Second Embodiment

In a printed circuit board and an electronic component device according to a second embodiment, different points from the printed circuit board PC1 and the electronic component device according to the first embodiment will be described.

Figure 4:
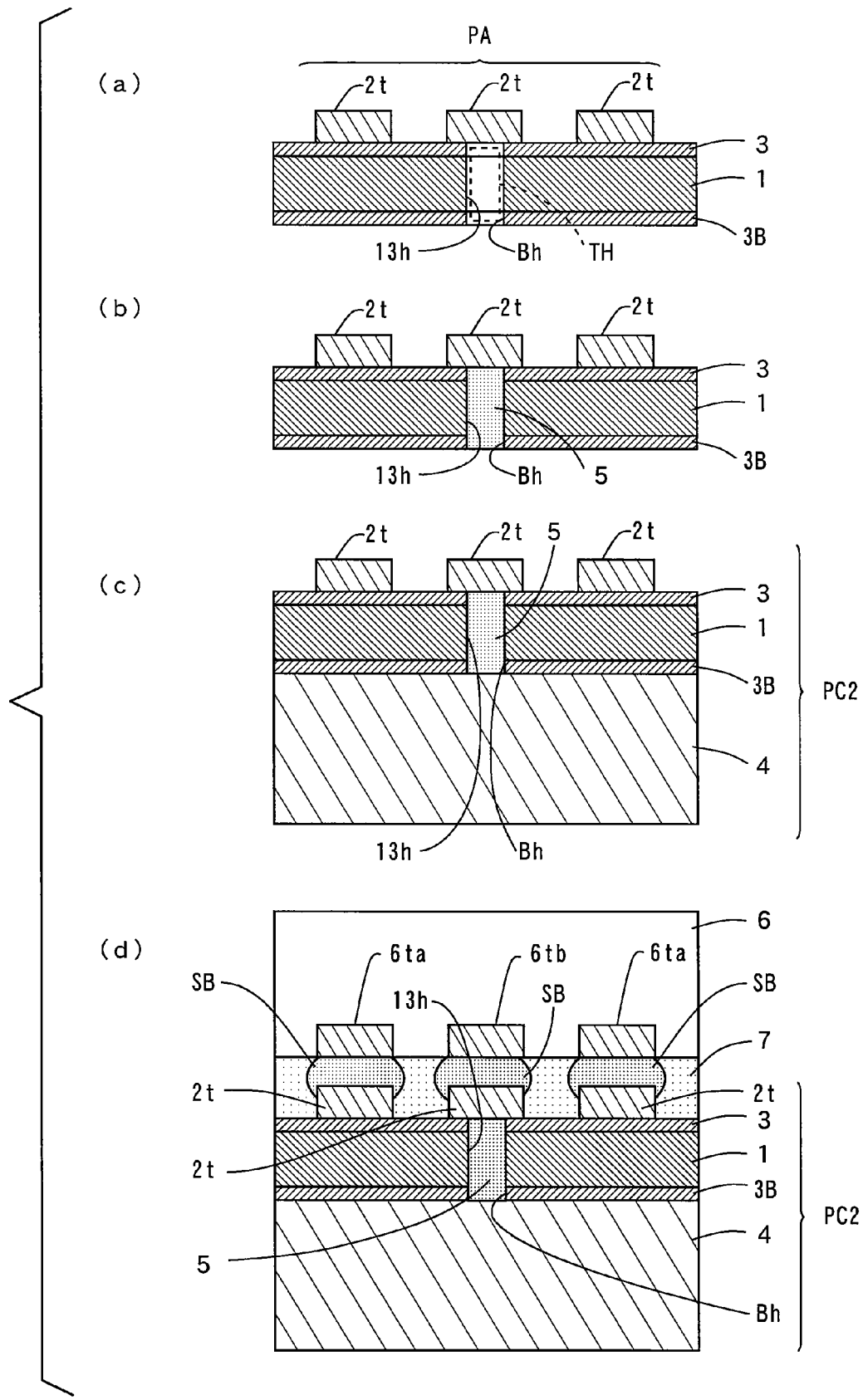
FIG. 4 is a manufacturing process diagram for use in explaining an example of a printed circuit board and an electronic component device according to a second embodiment.

FIG. 4 is a manufacturing process diagram for use in explaining an example of the printed circuit board and the electronic component device according to the second embodiment. In this embodiment, first of all, a laminate of FIG. 1(d) which is described in the first embodiment is fabricated as shown in FIG. 4(a).

Next, as shown in FIG. 4(b), an opening space TH which is formed by a hole 13h of a base insulating layer 1 and a sheet-like adhesive 3 and a through hole Bh of a sheet-like adhesive 3B is filled with metallic paste 5 by screen printing.

Then, as shown in FIG. 4(c), a reinforcing board 4 is attached to the lower surface of the base insulating layer 1 by the sheet-like adhesive 3B. Thus, a terminal part 2t and the reinforcing board 4 are connected through the metallic paste 5 which is filled in the opening space TH. In this way, a printed circuit board PC2 is fabricated.

Finally, as shown in FIG. 4(d), an electronic component 6 is mounted on the printed circuit board PC2. In this way, the electronic component device according to the second embodiment is completed.

Also in this embodiment, the heat which is generated in the electronic component 6 is transmitted from a heat radiating terminal 6tb to the reinforcing board 4 through solder balls SB, the terminal part 2t and the metallic paste 5, and efficiently diffused from the outer surface thereof. Consequently, the heat radiation of the electronic component 6 is improved sufficiently.

Also in this embodiment, slits may be provided in the reinforcing board 4 to radiate the heat of the electronic component 6 from the electrically connecting terminals 6ta. In this case, the heat radiation of the electronic component 6 is further improved.

Third Embodiment

In a printed circuit board and an electronic component device according to a third embodiment, different points from the printed circuit board PC1 and the electronic component device according to the first embodiment will be described.

Figure 5:
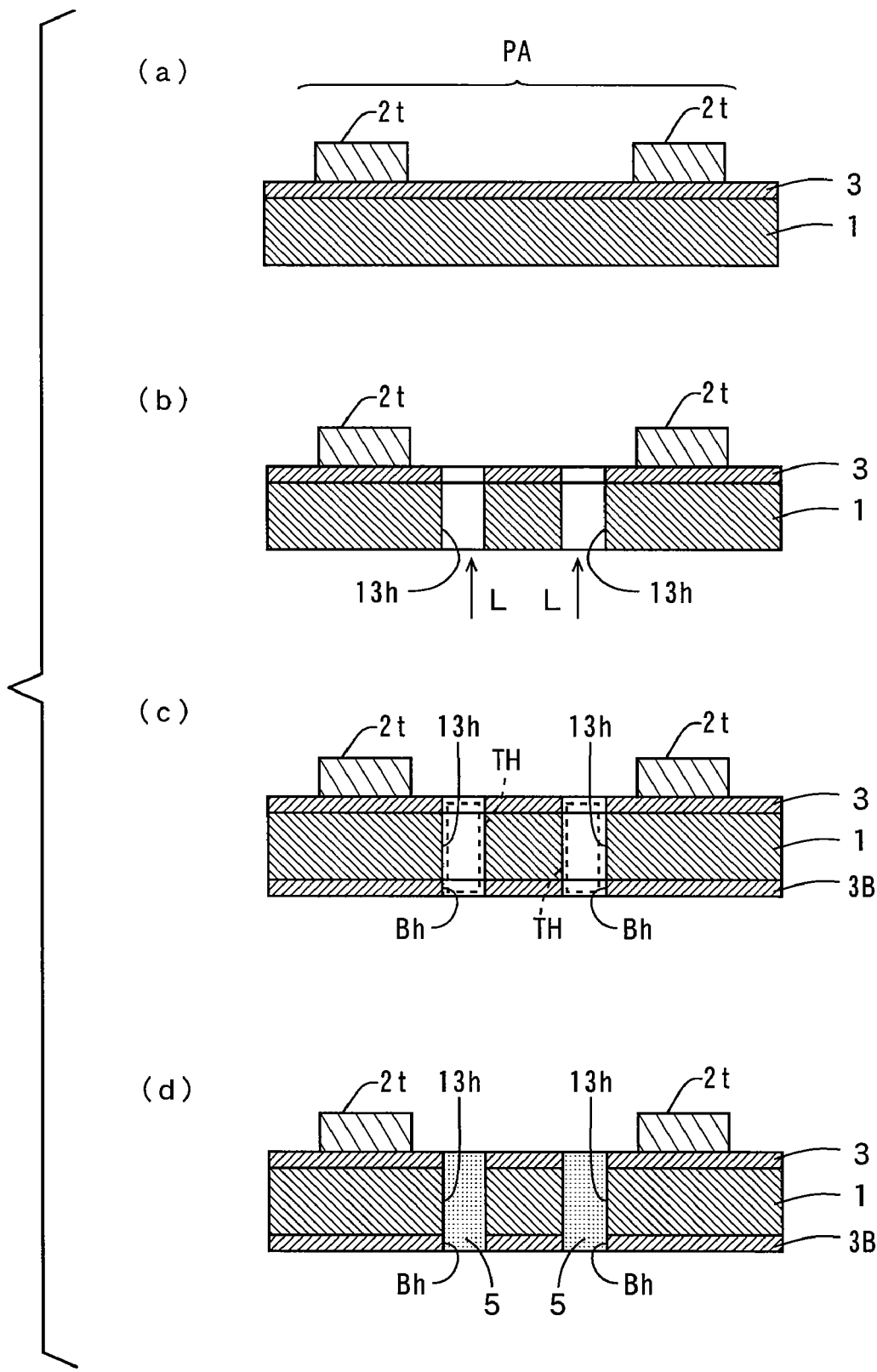
FIG. 5 is a manufacturing process diagram for use in explaining an example of a printed circuit board and an electronic component device according to a third embodiment.
Figure 6:
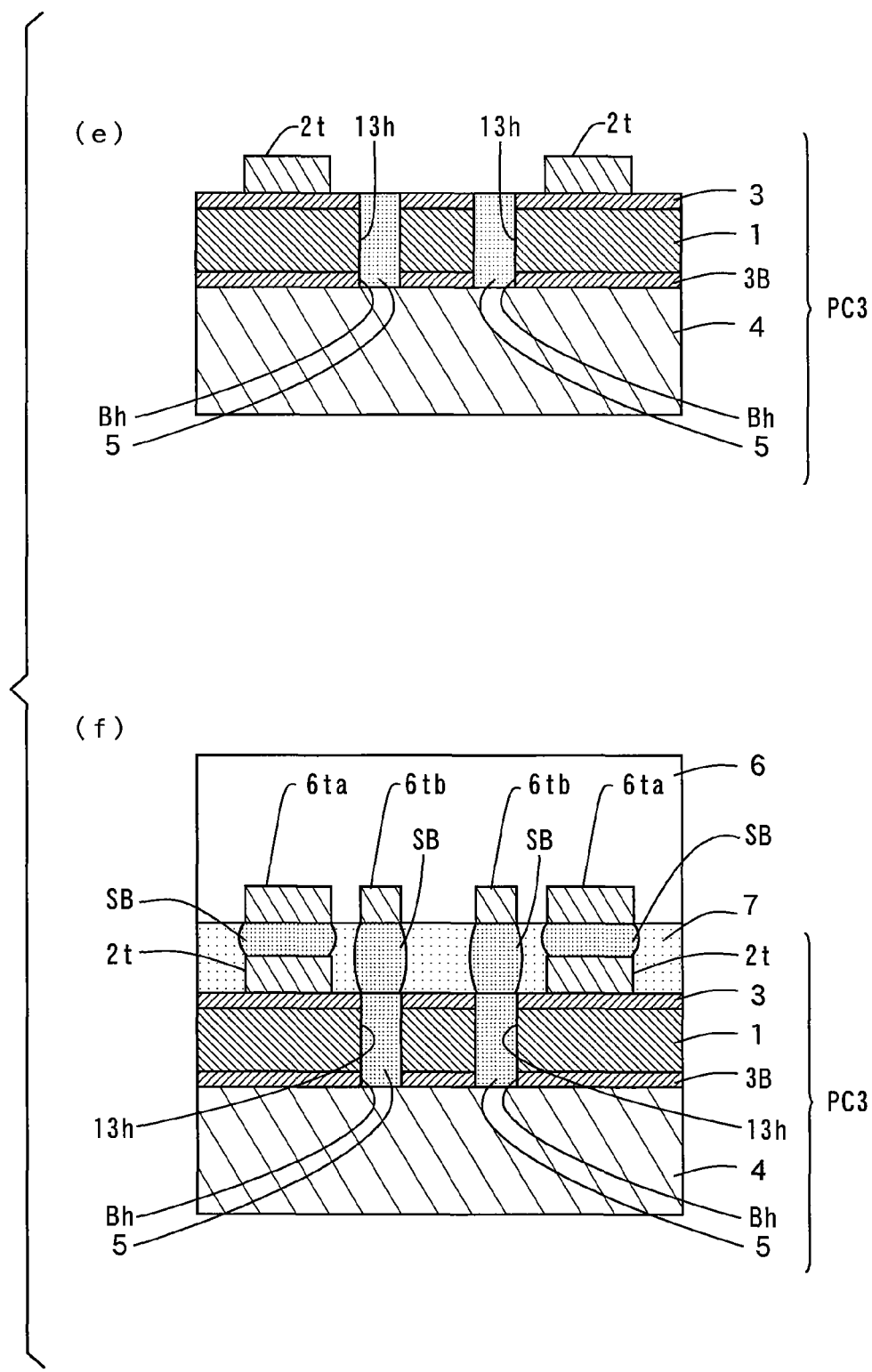
FIG. 6 is a manufacturing process diagram for use in explaining the example of the printed circuit board and the electronic component device according to the third embodiment.

FIG. 5 and FIG. 6 are manufacturing process diagrams for use in explaining an example of the printed circuit board and the electronic component device according to the third embodiment.

In this embodiment, similarly to the first embodiment, first, a base material BW of FIG. 1(a) is prepared, and a metallic layer 2 on a base insulating layer 1 is processed into a predetermined pattern as shown in FIG. 5(a). In this way, a conductor pattern PA including wiring parts and terminal parts 2t is formed.

Next, as shown in FIG. 5(b), holes 13h are formed by irradiating predetermined locations in a region of the base insulating layer 1 and a sheet-like adhesive 3 where the terminal parts 2t are not formed with a laser beam L from the lower surface of the insulating layer 1.

Then, as shown in FIG. 5(c), a sheet-like adhesive 3B with through holes Bh having substantially the same diameter as that of the hole 13h is attached to the lower surface of the base insulating layer 1. In this way, opening spaces TH are formed by the holes 13h and the through holes Bh.

Next, as shown in FIG. 5(d), the opening spaces TH formed by the holes 13h in the base insulating layer 1 and the sheet-like adhesive 3 and the through holes Bh in the sheet-like adhesive 3B are filled with metallic paste 5 by screen printing.

Then, as shown in FIG. 6(e), a reinforcing board 4 is attached to the lower surface of the base insulating layer 1 by the sheet-like adhesive 3B. Consequently, the reinforcing board 4 is connected to the metallic paste 5 which is filled in the opening spaces TH, so that a printed circuit board PC3 including the base insulating layer 1, the terminal parts 2t, the sheet-like adhesives 3, 3B and the reinforcing board 4 is fabricated.

Finally, as shown in FIG. 6(f), an electronic component 6 is mounted on the printed circuit board PC3. In this way, the electronic component device according to the third embodiment is completed.

Note that the electronic component 6 is provided with electrically connecting terminals 6ta and heat radiating terminals 6tb in this embodiment. Thus, when the electronic component 6 is mounted on the printed circuit board PC3, the heat radiating terminals 6tb are connected to the upper surface of the exposed metallic paste 5 by solder balls SB.

Also in this embodiment, the heat generated in the electronic component 6 is transmitted from the heat radiating terminals 6tb to the reinforcing board 4 through the solder balls SB and the metallic paste 5, and efficiently diffused from the outer surface thereof. Consequently, the heat radiation of the electronic component 6 is sufficiently improved.

In addition, also in this embodiment, slits may be provided in the reinforcing board 4 to radiate the heat of the electronic component 6 from the electrically connecting terminals 6ta. In this case, the heat radiation of the electronic component 6 is further improved.

Fourth Embodiment

In a printed circuit board and an electronic component device according to a fourth embodiment, different points from the printed circuit board PC1 and the electronic component device according to the first embodiment will be described.

Figure 7:
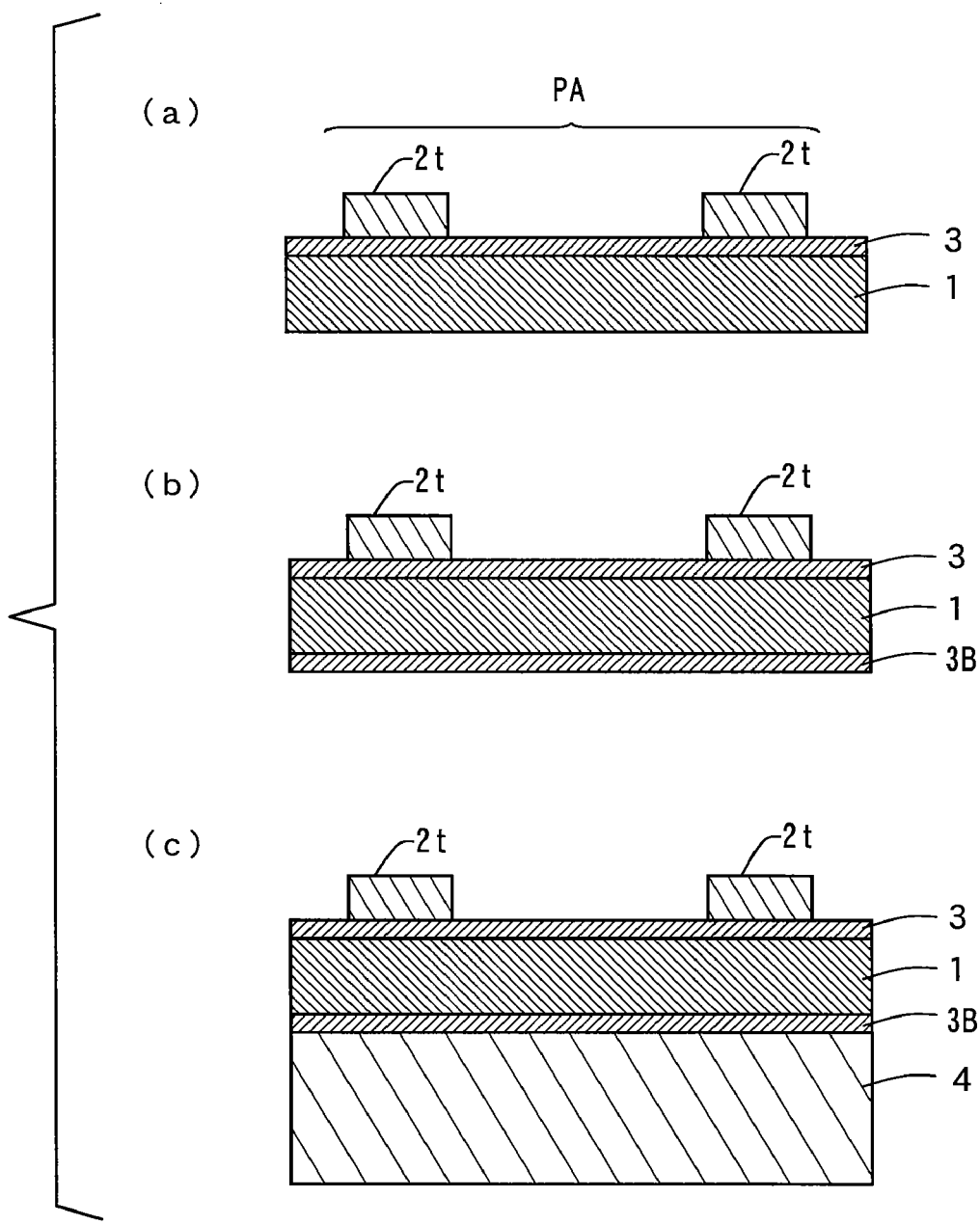
FIG. 7 is a manufacturing process diagram for use in explaining an example of a printed circuit board and an electronic component device according to a fourth embodiment.
Figure 8:
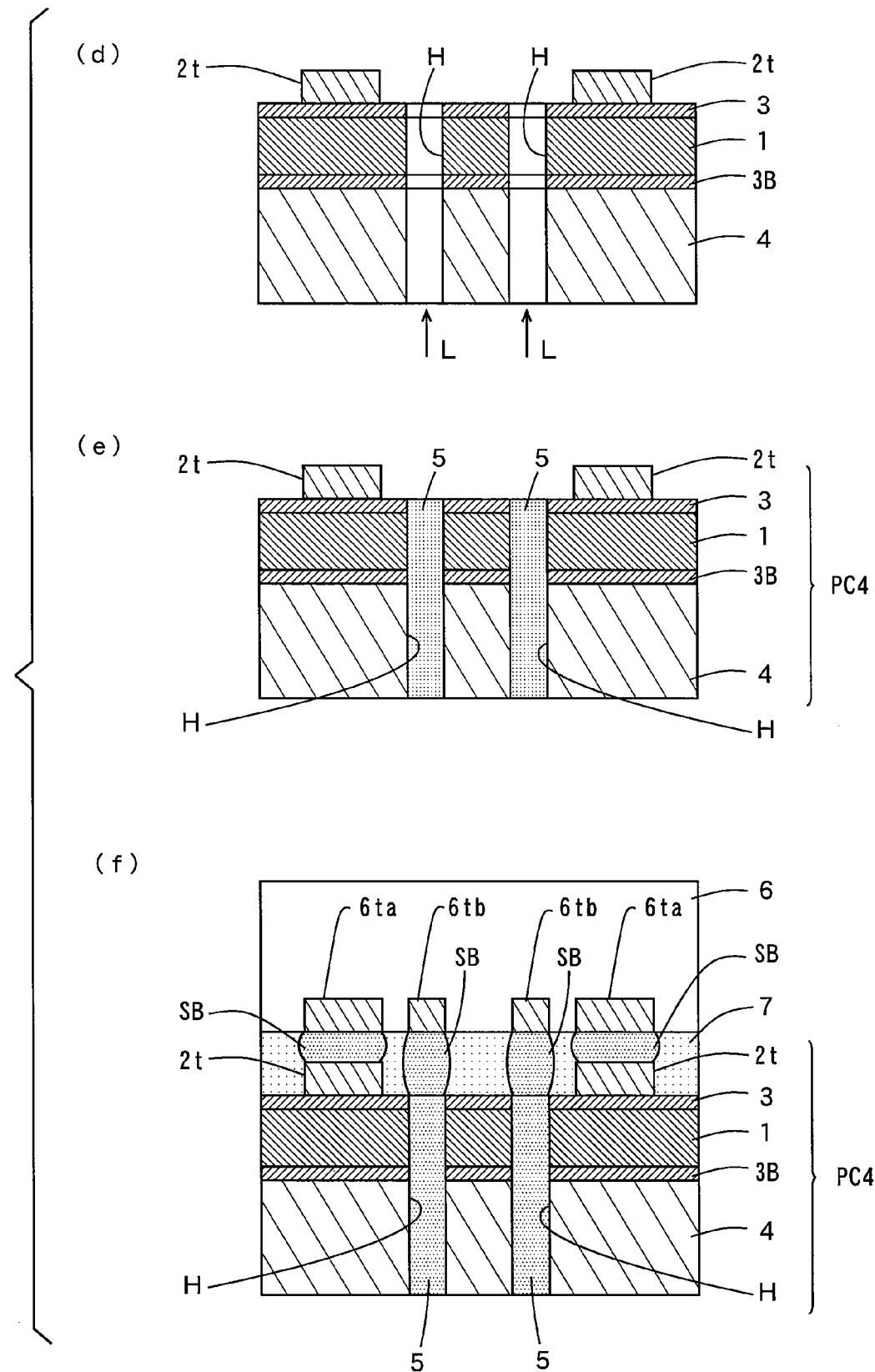
FIG. 8 is a manufacturing process diagram for use in explaining the example of the printed circuit board and the electronic component device according to the fourth embodiment.

FIG. 7 and FIG. 8 are manufacturing process diagrams for use in explaining an example of the printed circuit board and the electronic component device according to the fourth embodiment.

In this embodiment, similarly to the first embodiment, first of all, a base material BW of FIG. 1(a) is prepared, and a metallic layer 2 on a base insulating layer 1 is processed into a predetermined pattern as shown in FIG. 7(a). In this way, a conductor pattern PA including wiring parts and terminal parts 2t is formed.

Next, as shown in FIG. 7(b), a sheet-like adhesive 3B is attached to the lower surface of the base insulating layer 1. Additionally, as shown in FIG. 7(c), a reinforcing board 4 is attached to the lower surface of the sheet-like adhesive 3B.

In this state, as shown in FIG. 8(d), through holes H are formed by irradiating predetermined locations in a region of the base insulating layer 1, sheet-like adhesives 3, 3B and the reinforcing board 4 where terminal parts 2t are not formed with a laser beam L from the lower surface of the reinforcing board 4.

Then, as shown in FIG. 8(e), metallic paste 5 is filled in the inner spaces of the through holes H in the base insulating layer 1, the sheet-like adhesives 3, 3B and the reinforcing board 4 by screen printing. In this way, a printed circuit board PC4 including the base insulating layer 1, the terminal parts 2t, the sheet-like adhesives 3, 3B and the reinforcing board 4 is fabricated.

Finally, as shown in FIG. 8(f), an electronic component 6 is mounted on the printed circuit board PC4. Thus, the electronic component device according to the fourth embodiment is completed.

Note that electrically connecting terminals 6ta and heat radiating terminals 6tb are provided in the electronic component 6 in this embodiment. Accordingly, when the electronic component 6 is mounted on the printed circuit board PC4, the heat radiating terminals 6tb are connected to the upper surfaces of the exposed metallic paste 5 by solder balls SB.

Also in this embodiment, the heat generated in the electronic component 6 is transmitted from the heat radiating terminals 6tb to the reinforcing board 4 through the solder balls SB and the metallic paste 5, and efficiently diffused from the outer surface thereof. Consequently, the heat radiation of the electronic component 6 is sufficiently improved.

In addition, also in this embodiment, slits may be provided in the reinforcing board 4 to radiate the heat of the electronic component 6 from the electrically connecting terminals 6ta. In this case, the heat radiation of the electronic component 6 is further improved.

INVENTIVE EXAMPLES

Figure 9:
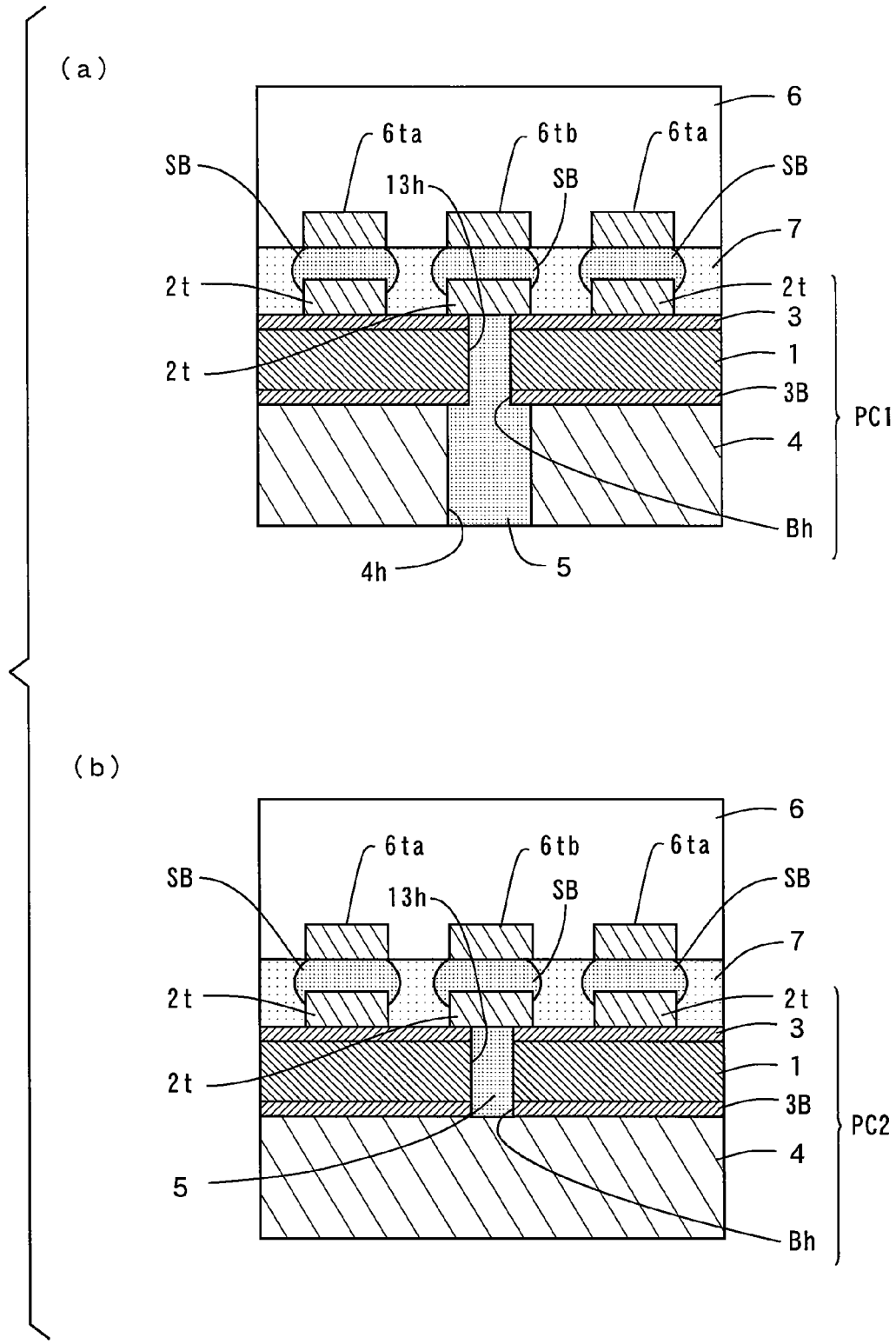
FIG. 9 is a diagram showing an electronic component device of an inventive example.

FIG. 9 and FIG. 10 are diagrams showing electronic component devices of inventive examples 1 to 4.

Inventive Example 1

In accordance with the method for manufacturing the electronic component device described in the first embodiment, an electronic component device of an inventive example 1 was fabricated. The fabricated electronic component device of the inventive example 1 is shown in FIG. 9(a). Specifically, the electronic component device of the inventive example 1 was fabricated as follows:

First, a base material BW was prepared where a base insulating layer 1 made of polyimide having a thickness of 25 μm and a metallic layer 2 made of a copper foil having a thickness of 12.5 μm are laminated with a sheet-like adhesive 3 sandwiched therebetween (see FIG. 1(a)).

Then, a conductor pattern PA including terminal parts 2t and wiring parts (see FIG. 1(b)) was formed by etching the metallic layer 2, which was attached on the base insulating layer 1. Next, a hole 13h having a diameter of 100 μm was formed in the base insulating layer 1 and the sheet-like adhesive 3 by directing a YAG laser beam from the lower surface of the base insulating layer 1 to a region of the base insulating layer 1 and the sheet-like adhesive 3 under a predetermined terminal part 2t.

Next, a sheet-like adhesive 3B with a through hole Bh having the same diameter as that of the hole 13h was attached to the lower surface of the base insulating layer 1, with the hole 13h and the through hole Bh being aligned with each other.

A stainless-steel board having a thickness of 350 μm was subsequently prepared as a reinforcing board 4, and a YAG laser beam was directed to the reinforcing board 4, so that a through hole 4h having a slightly larger diameter than that of the hole 13h and the through hole Bh was formed. Then, the processed reinforcing board 4 was attached to the lower surface of the sheet-like adhesive 3B with the hole 13h, the through hole Bh and the through hole 4h being aligned with one another.

Next, Cu paste as metallic paste 5 was filled by screen printing in an opening space TH (see FIG. 2(f)), which was formed by the hole 13h and the through holes Bh, 4h. In this way, a printed circuit board PC1 of the inventive example 1 was fabricated.

Then, electrically connecting terminals 6ta and a heat radiating terminal 6tb of an electronic component 6 were arranged on the terminal parts 2t by solder balls SB, and heated and pressurized.

Next, liquid epoxy resin as sealing resin 7 was filled in a gap between the printed circuit board PC1 and the electronic component 6. In this way, the electronic component device of the inventive example 1 was completed.

Note that the electrically connecting terminals 6ta and the heat radiating terminal 6tb, provided in the electronic component 6 are 2.3 mm-square chip terminals of a 660 μm thickness.

Inventive Example 2

In accordance with the method for manufacturing the electronic component device which is described in the second embodiment, an electronic component device of an inventive example 2 was fabricated. FIG. 9(b) shows the fabricated electronic component device of the inventive example 2. Specifically, the electronic component device of the inventive example 2 was fabricated as follows:

Similarly to the inventive example 1, a base material BW (see FIG. 1(a)) was prepared, a conductor pattern PA including terminal parts 2t was formed, a hole 13h of a base insulating layer 1 and a sheet-like adhesive 3 was formed, a through hole Bh of a sheet-like adhesive 3B was formed, and the sheet-like adhesive 3B was attached to the base insulating layer 1.

Then, an opening space TH, which was formed by the hole 13h in the base insulating layer 1 and the sheet-like adhesive 3 and the through hole Bh in the sheet-like adhesive 3B (see FIG. 4(a)), was filled with Cu paste as metallic paste 5 by screen printing. Next, a stainless-steel board having a thickness of 350 μm as a reinforcing board 4 was attached to the lower surface of the sheet-like adhesive 3B. In this way, a printed circuit board PC2 of the inventive example 2 was fabricated.

Finally, similarly to the inventive example 1, electrically connecting terminals 6ta and a heat radiating terminal 6tb of an electronic component 6 were arranged on the terminal parts 2t with solder balls SB, and then heated and pressurized.

Then, liquid epoxy resin as sealing resin 7 was filled in a gap between a printed circuit board PC2 and the electronic component 6. In this way, the electronic component device of the inventive example 2 was completed.

Inventive Example 3

In accordance with the method for manufacturing the electronic component device which was described in the third embodiment, an electronic component device of an inventive example 3 was fabricated. FIG. 10(c) shows the fabricated electronic component device of the inventive example 3. Specifically, the electronic component device of the inventive example 3 was fabricated as follows:

Similarly to the inventive example 1, first, a base material BW (see FIG. 1(a)) was prepared, and a conductor pattern PA including terminal parts 2t was formed.

Next, a hole 13h having a diameter of 100 μm was formed in a base insulating layer 1 and a sheet-like adhesive 3 by directing a YAG laser beam from the lower surface of the base insulating layer 1 to a predetermined location in a region of the base insulating layer 1 and the sheet-like adhesive 3 where the terminal parts 2t are not formed.

A through hole Bh in a sheet-like adhesive 3B was subsequently formed, and the sheet-like adhesive 3B was attached to the base insulating layer 1.

Then, an opening space TH, which was formed by the hole 13h in the base insulating layer 1 and the sheet-like adhesive 3 and the through hole Bh in the sheet-like adhesive 3B (See FIG. 5(c)) was filled with Cu paste as metallic paste 5 by screen printing. Then, a reinforcing board 4 was attached to the lower surface of the base insulating layer 1 by the sheet-like adhesive 3B. Note that a stainless steel board having a thickness of 350 μm was used as the reinforcing board 4. In this way, a printed circuit board PC3 of the inventive example 3 was produced.

Finally, electrically connecting terminals 6ta of an electronic component 6 were arranged on the terminal parts 2t by solder balls SB, while a heat radiating terminal 6tb of the electronic component 6 was arranged on the upper end of the exposed metallic paste 5 by a solder ball SB, and then those terminals were heated and pressurized.

Next, liquid epoxy resin as sealing resin 7 was filled in a gap between the printed circuit board PC3 and the electronic component 6. In this way, the electronic component device of the inventive example 3 was completed.

Inventive Example 4

In accordance with the method for manufacturing the electronic component device which was described in the fourth embodiment, an electronic component device of an inventive example 4 was fabricated. FIG. 10(d) shows the fabricated electronic component device of the inventive example 4. Specifically, the electronic component device of the inventive example 4 was fabricated as follows:

Similarly to the inventive example 1, first, a base material BW (see FIG. 1(a)) was prepared, and a conductor pattern PA including terminal parts 2t was formed.

Next, a stainless-steel board having a thickness of 350 μm as a reinforcing board 4 was attached to the lower surface of the base insluting layer 1 by a sheet-like adhesive 3B.

In this state, a through hole H having a diameter of 100 μm was formed in the base insulating layer 1, sheet-like adhesives 3, 3B and the reinforcing board 4 by directing a YAG laser beam from the lower surface of the reinforcing board 4 to a predetermined location in a region of the base insulating layer 1, the sheet-like adhesives 3, 3B and the reinforcing board 4 where terminal parts 2t were not formed. Then, an inner space of the through hole H was filled with Cu paste as metallic paste 5 by screen printing. In this way, a printed circuit board PC4 of the inventive example 4 was fabricated.

Finally, electrically connecting terminals 6ta of an electronic component 6 were arranged on the terminal parts 2t by solder balls SB, while a heat radiating terminal 6tb of the electronic component 6 was arranged on the upper end of the exposed metallic paste 5 by a solder ball SB, and those terminals were heated and pressurized.

Then, liquid epoxy resin as sealing resin 7 was filled in a gap between the printed circuit board PC4 and the electronic component 6. In this way, the electronic component device of the inventive example 4 was completed.

Comparative Example 1

Figure 11:
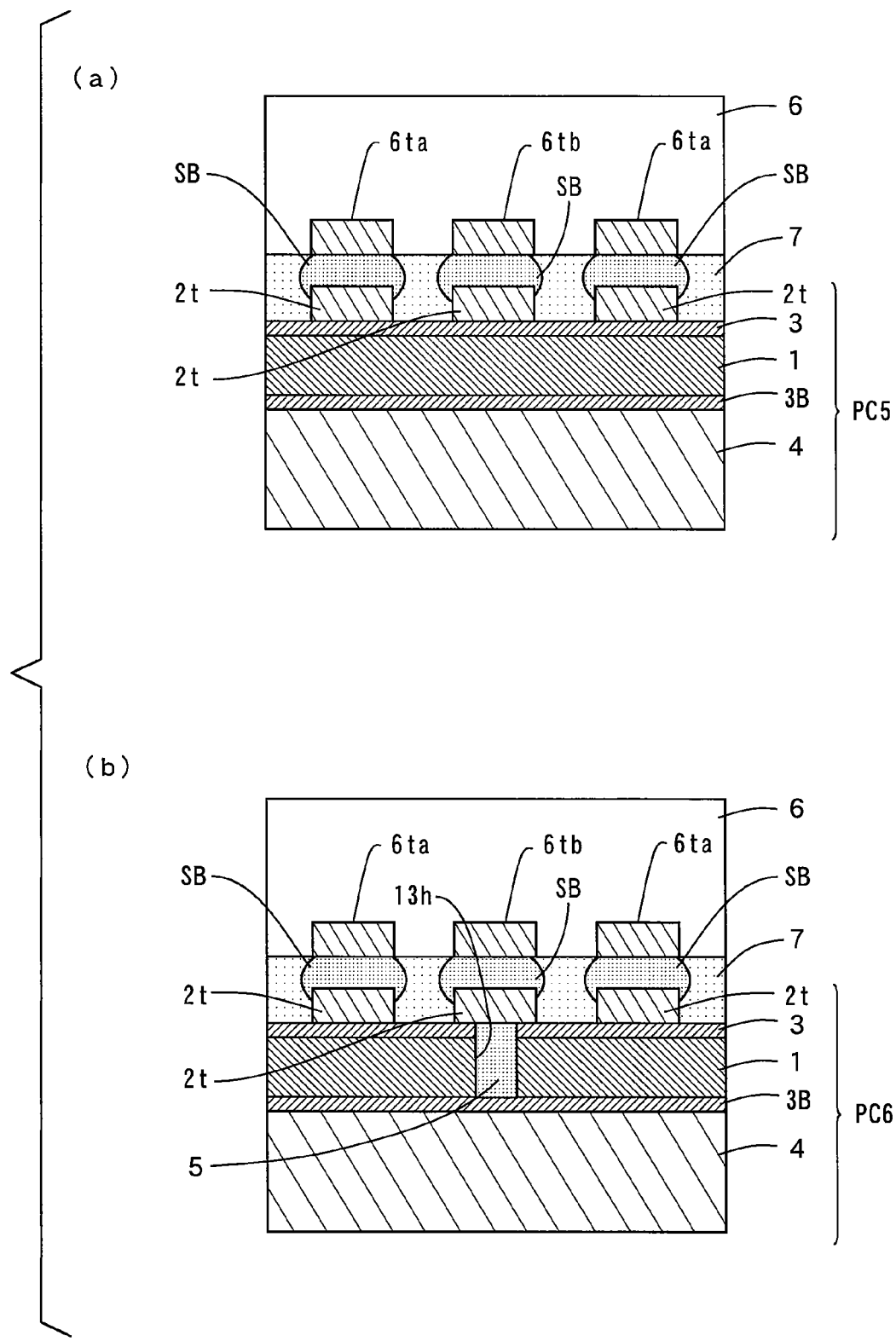
FIG. 11 is a diagram showing an electronic component device of a comparative example.
Figure 12:
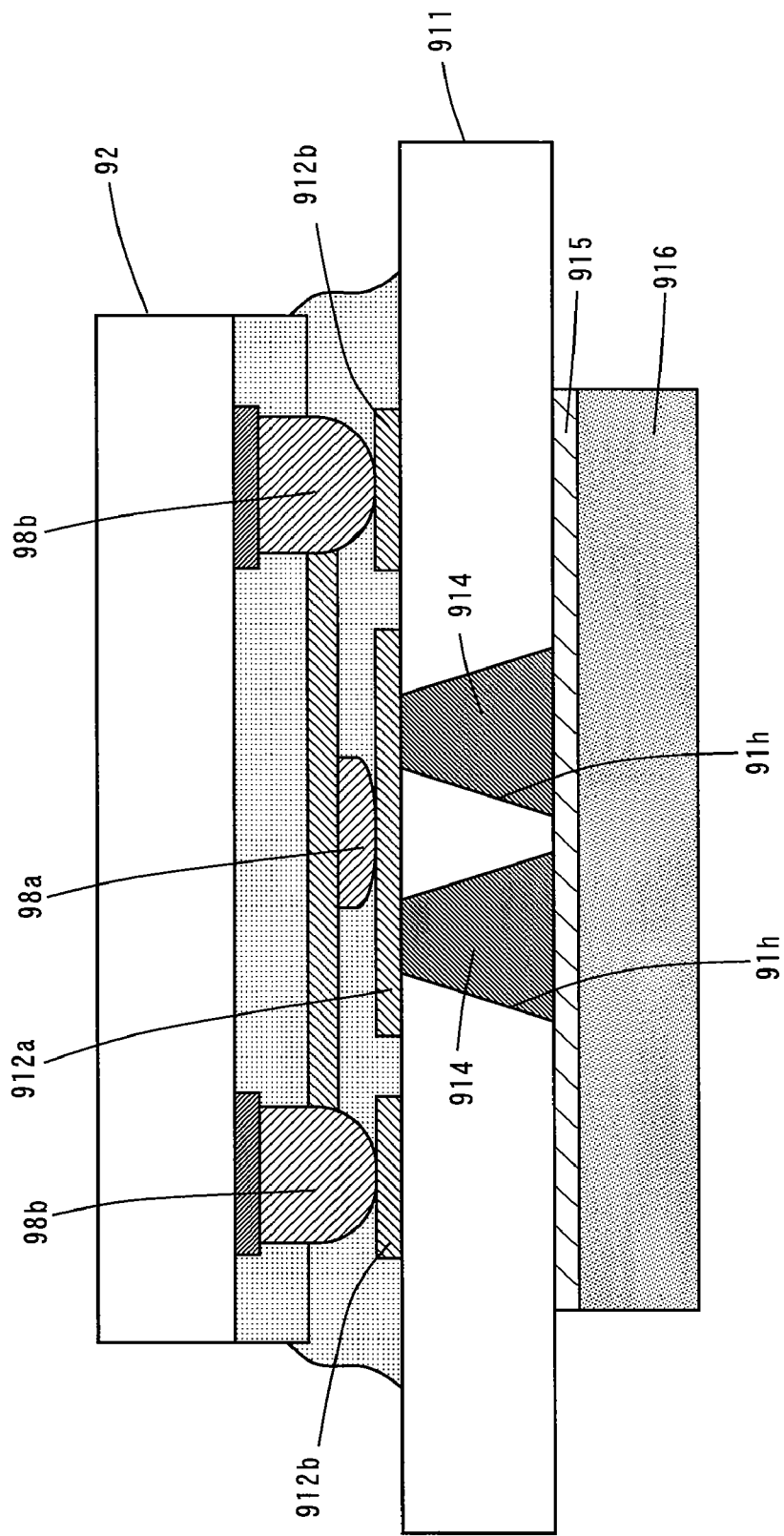
FIG. 12 is a diagram for use in explaining the structure of a semiconductor device of JP 2003-282778 A.

FIG. 11(a) is a diagram showing an electronic component device of a comparative example 1. As shown in FIG. 11(a), the electronic component device of the comparative example 1 was fabricated similarly to the inventive example 1.

In the manufacture of the electronic component device of the comparative example 1, a hole 13h was not formed in a base insulating layer 1 or a sheet-like adhesive 3, a through hole Bh was not formed in a sheet-like adhesive 3B, and a through hole 4h was not formed in a reinforcing board 4.

In this way, a printed circuit board PC5 was fabricated, and an electronic component 6 was mounted on the printed circuit board PC5, so as to complete the electronic component device of the comparative example 1.

Comparative Example 2

FIG. 11(b) is a diagram showing an electronic component device of a comparative example 2. The electronic component device of the comparative example 2 was fabricated as follows:

Similarly to the electronic component device of the inventive example 1, first, a base material BW (see FIG. 1(a)) was prepared, a conductor pattern PA including terminal parts 2t was formed, and a hole 13h in a base insulating layer 1 and a sheet-like adhesive 3 was formed.

An inner space of the hole 13h in the base insulating layer 1 and the sheet-like adhesive 3 was subsequently filled with Cu paste as metallic paste 5 by screen printing.

Next, a reinforcing board 4 was attached to the lower surface of the base insulating layer 1 by a sheet-like adhesive 3B. Note that a stainless-steel board having a thickness of 350 μm was used as the reinforcing board 4. In this way, a printed circuit board PC6 of the comparative example 2 was fabricated.

Then, liquid epoxy resin as sealing resin 7 was filled in a gap between the printed circuit board PC6 and the electronic component 6. In this way, the electronic component device of the comparative example 2 was completed.

Evaluation

The inventors evaluated the heat radiation of the respective electronic component devices of the inventive examples 1 to 4 and the comparative examples 1 and 2 fabricated as described above.

The evaluation was performed as follows. For the electronic component devices of the inventive examples 1 to 4 and the comparative examples 1 and 2, the respective electronic components 6 were driven for 20 minutes, and the values of the measured temperature of those were compared. The results of the evaluation were shown in Table 1 below.

TABLE 1

|  | Inventive example 1 | Inventive example 2 | Inventive example 3 | Inventive example 4 | Comparative example 1 | Comparative example 2 |
|---|---|---|---|---|---|---|
| Measured temperature value [° C.] | 126.7 | 132.4 | 125.6 | 131.5 | 153.4 | 150.8 |

As shown in Table 1, the measured temperature value of the electronic component 6 of the comparative example 1 was 153.4° C. and that of the comparative example 2 was 150.8° C.

In contrast, the measured temperature value of the electronic component 6 of the inventive example 1 was 126.7° C., that of the inventive example 2 was 132.4° C., that of the inventive example 3 was 125.6° C., and that of the inventive example 4 was 131.5° C.

As in the foregoing, the temperatures of respective electronic components 6 in the electronic component devices of the inventive examples 1 to 4 were about 20° C. to 30° C. lower than the temperature of the electronic component 6 in the electronic component device of the comparative example 1. In contrast, the temperature of the electronic component 6 in the electronic component device of the comparative example 2 was only about 2° C. to 3° C. lower than the temperature of the electronic component 6 in the electronic component device of the comparative example 1.

In the electronic component device of the comparative example 2, the hole 13h was provided in the base insulating layer 1 and the sheet-like adhesive 3 with the metallic paste 5 filled therein. However, it is considered that the connection of the metallic paste 5 and the reinforcing board 4 was cut off by the sheet-like adhesive 3B, so that a thermal conduction path was blocked, resulting in insufficient heat radiation.

Accordingly, it became clear that in the printed circuit boards PC1 to PC4 of the inventive examples 1 to 4, the heat of the electronic component 6 could be radiated more sufficiently than in the printed circuit boards PC5 and PC6 of the comparative examples 1 and 2.

Correspondences between Structural Elements in Claims and Elements in Embodiments In the following paragraphs, non-limiting examples of correspondences between various elements recited in the claims below and those described above with respect to various embodiments of the present invention are explained.

In the above embodiments, the electrically connecting terminals 6ta and the heat radiating terminal 6tb of the electronic component 6 are examples of an external terminal, the hole 13h and the through hole H are examples of a through hole, the metallic paste 5 is an example of a thermal conductive material, the sheet-like adhesive 3B is an example of an adhesive layer, the through hole Bh and the through hole H formed in the sheet-like adhesive 3B are examples of a hole, and the through hole 4h and the through hole H of the reinforcing board 4 are examples of an opening.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A printed circuit board on which an electronic component having a plurality of external terminals is to be mounted, comprising:
    an insulating layer having a plurality of through holes;
    a terminal part provided on one surface of said insulating layer and connectable to any of said plurality of external terminals of said electronic component;
    a reinforcing board having thermal conductivity provided on the other surface of said insulating layer; and
    a thermal conductive material filled in said plurality of through holes, wherein
    said thermal conductive material is brought into contact with said terminal part or exposed on said one surface of said insulating layer to be connectable to any of said plurality of external terminals of said electronic component, while being brought into contact with said reinforcing board, and
    a plurality of portions in said reinforcing board that are in contact with said thermal conductive material in said plurality of through holes are insulated from one another, wherein
    said reinforcing board has a plurality of openings that communicate with said plurality of through holes, and said thermal conductive material is filled in said plurality of through holes and said plurality of openings.

2. The printed circuit board according to claim 1, further comprising:
    an adhesive layer provided between said insulating layer and said reinforcing board, wherein
    said adhesive layer has a plurality of holes that communicate with said plurality of through holes, and
    said thermal conductive material is filled in said plurality of through holes of said insulating layer and said plurality of holes of said adhesive layer so as to be brought into contact with said reinforcing board.

3. The printed circuit board according to claim 1, wherein said plurality of through holes are provided in a region of a back surface side of said terminal part in said insulating layer, and
    said thermal conductive material is filled in said plurality of through holes so as to be brought into contact with the back surface of said terminal part.

4. The printed circuit board according to claim 1, wherein said plurality of through holes are provided in a region of said insulating layer excluding said terminal part, and
    said thermal conductive material is filled in said plurality of through holes so as to be exposed on said one surface of said insulating layer.

5. An electronic component device comprising:
    an electronic component including a plurality of external terminals; and
    a printed circuit board on which said electronic component is mounted, wherein
    said printed circuit board includes
    an insulating layer having a plurality of through holes,
    a terminal part provided on one surface of said insulating layer, connected to any of a plurality of external terminals of said electronic component, a reinforcing board having thermal conductivity provided on the other surface of said insulating layer, and a thermal conductive material filled in said plurality of through holes, wherein said thermal conductive material is brought into contact with said terminal part or connected to any of said plurality of external terminals of said electronic component, while being brought into contact with said reinforcing board, and a plurality of portions in said reinforcing board that are in contact with said thermal conductive material in said plurality of through holes are insulated from one another, wherein said reinforcing board has a plurality of openings that communicate with said plurality of through holes, and said thermal conductive material is filled in said plurality of through holes and said plurality of openings.

* * * * *